(12) United States Patent
Oyama et al.

(10) Patent No.: US 7,109,948 B2
(45) Date of Patent: Sep. 19, 2006

(54) DIELECTRIC ANTENNA MODULE

(75) Inventors: Ryuji Oyama, Ube (JP); Morito Yasumura, Tokyo (JP)

(73) Assignee: UBE Industries, Ltd., Yamaguchi (JP)

( * ) Notice: Subject to any disclaimer, the term of this patent is extended or adjusted under 35 U.S.C. 154(b) by 29 days.

(21) Appl. No.: 10/496,065

(22) PCT Filed: Nov. 19, 2002

(86) PCT No.: PCT/JP02/12059

§ 371 (c)(1),
(2), (4) Date: May 19, 2004

(87) PCT Pub. No.: WO03/044891

PCT Pub. Date: May 30, 2003

(65) Prior Publication Data

US 2005/0017902 A1    Jan. 27, 2005

(30) Foreign Application Priority Data

Nov. 20, 2001  (JP)  ............................. 2001-354179
Nov. 20, 2001  (JP)  ............................. 2001-354180

(51) Int. Cl.
*H01Q 1/00* (2006.01)
*H01Q 1/38* (2006.01)

(52) U.S. Cl. ............................. 343/904; 343/700 MS

(58) Field of Classification Search ............... 343/850, 343/853, 702, 700 MS, 904, 905, 907; 342/170, 342/175

See application file for complete search history.

(56) References Cited

U.S. PATENT DOCUMENTS

| | | | |
|---|---|---|---|
| 5,394,154 A * | 2/1995 | Uematsu et al. ............ | 342/165 |
| 5,488,380 A * | 1/1996 | Harvey et al. .............. | 342/368 |
| 5,995,049 A * | 11/1999 | Komatsu et al. ..... | 343/700 MS |
| 6,320,543 B1* | 11/2001 | Ohata et al. ......... | 343/700 MS |
| 6,476,463 B1* | 11/2002 | Kaneko et al. ............. | 257/660 |
| 6,542,050 B1* | 4/2003 | Arai et al. .................. | 333/134 |

FOREIGN PATENT DOCUMENTS

| | | |
|---|---|---|
| JP | 64-6089 | 1/1989 |
| JP | 07202538 A | 8/1995 |
| JP | 09153734 A | 6/1997 |
| JP | 10256818 A | 9/1998 |

(Continued)

*Primary Examiner*—Shih-Chao Chen
*Assistant Examiner*—Minh Dieu A
(74) *Attorney, Agent, or Firm*—Frommer Lawrence & Haug LLP; Ronald R. Santucci

(57) ABSTRACT

A dielectric antenna module (1) includes an antenna element unit (50) having an antenna element (5) consisting of a radiation electrode (3) and a signal line (4) formed on a dielectric substrate (2), and a module substrate unit (60) having a signal processing circuit formed on a module substrate (6). The substrate (2,6) are arranged and connected to each other so that their bottom surfaces form a single plane. The antenna element unit (50) and the module substrate unit (60) are connected to each other by fitting a projection (8) to a recess (9) formed on and in the opposing faces of the substrates (2,6). On the projection (8) and in the recess (9), signal lines (4,4a) are formed, respectively, and on the opposing faces of the substrates (2,6), ground electrodes (11,11a) are formed. When the projection and recesses are engaged, the signal lines (4,4a) are connected to each other and the ground electrodes (11,11a) are connected to each other. A base film (10) where a ground electrode is formed is attached to the bottom surface of the substrates (2,6).

5 Claims, 6 Drawing Sheets

FOREIGN PATENT DOCUMENTS

| | | |
|---|---|---|
| JP | 10261914 A | 9/1998 |
| JP | 11112221 A | 4/1999 |
| JP | 20000114843 A | 4/2000 |
| JP | 2001085920 A | 3/2001 |
| JP | 2001267826 A | 9/2001 |

* cited by examiner

DIELECTRIC ANTENNA MODULE

This application is a 371 of PCT/JP02/12059 filed on Nov. 19, 2002, published on May 30, 2003 under publication number WO 03/044891 A1 and claims priority benefits of Japanese Patent Application No. 2001-354179 filed Nov. 20, 2001 and Japanese Patent Application No. 2001-354180 filed Nov. 20, 2001.

TECHNICAL FIELD

The present invention relates to a dielectric antenna module, suitable for microwave and millimeter wave, in which an antenna element in which a plane radiation electrode is formed on a dielectric substrate, and a module substrate on which a signal processing circuit is formed, are connected to each other. Also, the present invention relates to a dielectric antenna module, suitable for microwave and millimeter wave, in which an antenna unit and a signal processing circuit unit are formed on a single dielectric substrate. In particular, a dielectric antenna module of the present invention is most suitable for Bluetooth or the like.

BACKGROUND ART

In recent years, in addition to mobile communication systems, in particular, communication systems using mobile phones or mobile terminals, systems for dealing with information communication such as Bluetooth is being rapidly put to practical use. Particularly in Bluetooth, because a communication module constituting a communication system is added to a conventional device, the communication module is requested to be compact, light in weight, and high in performance in order to maintain the original design of the device. On the other hand, in case of card-shaped communication modules and the like used for data communication using mobile phones or personal computers, there is a tendency that they are made thinner and smaller.

In general, as shown in FIG. 10, such a communication module is formed in such a manner that an antenna element 205 in which a radiation electrode 203 is formed on a surface of a dielectric substrate 202, is mounted at a predetermined position on the upper face of a module substrate 206 on which a signal processing circuit is formed.

In this communication module, in order to meet the above-described request of reducing the size of the communication module, in the module substrate 206, the integration of a high frequency circuit unit IC, a baseband unit IC, and so on, for processing signals to be transmitted to the antenna element 205 and signals received from the antenna element 205, has been improved, and the circuit substrate has been made smaller and thinner by forming passive elements in a laminated substrate, which elements were conventionally arranged on the substrate.

On the other hand, for the antenna element, there are various forms such as a dipole antenna, a monopole antenna, an inverted F-type antenna, and a microstrip antenna. Of them, there is a tendency of adopting the monopole antenna or microstrip antenna, in which a radiation electrode made of conductive material is formed on a dielectric substrate. This is because that they are antennas utilizing radiation loss of an open type resonance circuit; they are low in profile and light in weight and suitable for reduction in size; they are easy to manufacture; and so on. The monopole antenna is suitable for operation in broader band frequencies than a microstrip antenna. Such antennas are disclosed in JP-A-9-153734, JP-A-11-112221, etc.

As described above, such a dielectric antenna module is requested to have the optimum construction that enable to obtain sufficient transmission/reception characteristics in the combination of the antenna element 205 and the module substrate 206, and further to be made compact, light in weight, and high in performance. In the conventional dielectric antenna module as shown in FIG. 10, however, the antenna element 205, an IC chip 207, etc., are disposed on the upper face of the module substrate 206. Thus, in order to meet the request of reducing the thickness of the module, the thickness of the antenna element 205 must be set to a value corresponding to the height of the peripheral parts such as IC chips so that the antenna element 205 does not protrude upward. However, in the antenna element 205, differently from the other parts, a free space provided in the vicinity of the radiation electrode 203 for stabilizing the transmission/reception characteristics. Thus, in practice, there is a restriction that the height of the antenna element must be somewhat lower than the peripheral parts.

However, it is known in general that reducing the thickness of such an antenna element may bring about a reduction in band width (an increase in unloaded Q) and thus a reduction in radiation efficiency. The thickness of the dielectric antenna element mounted on such a module is in general very small as $\frac{1}{10}$ or less of the electric signal wavelength. Therefore, the reduction rates of the band width and radiation efficiency by reducing the thickness of the antenna element are high. Thus, in case that an antenna for broad band communication such as Bluetooth is reduced in size, designing for broad band had to be done at the sacrifice of gain or radiation efficiency. Because the thicker antenna element brings about the less sacrifice of gain or radiation efficiency, it is advantageous on the point of broad band. Thus, in case of attaching great importance to the antenna performance, the antenna element may be mounted as the tallest part on the module substrate.

In addition, because electric signal loss occurs in the connecting portion between the antenna element unit and the module substrate unit and in the transmission line, it is desired that the number of connecting portions is reduced as much as possible and the transmission line is shortened as much as possible. In case that the antenna element is adjacent to the module substrate to shorten the transmission line, the interference may occur between the respective electromagnetic components generated therein. There is a necessity of suppressing the interference.

DISCLOSURE OF THE INVENTION

An object of the present invention is to provide a dielectric antenna module in which its height when mounted is small, the interference between electromagnetic components of an antenna element and a module substrate is hard to occur, and there is little loss of electric signals.

In order to achieve the above object, there is provided a dielectric antenna module comprising:

an antenna element unit in which a radiation electrode and a signal line are formed on a dielectric substrate; and a module substrate unit in which a signal processing circuit is formed, wherein the antenna element unit and the module substrate unit are disposed and connected to each other so that side faces thereof are opposed each other and bottom faces of the antenna element unit and the module substrate unit are in a single plane, and the antenna element unit and the module substrate unit are connected to each other by fitting through projection/recess structure portions formed on the opposed side faces of the antenna element unit and the module substrate unit.

In an aspect of the present invention, signal lines are formed on the projection/recess structure portions formed on the opposed side faces of the antenna element unit and the module substrate unit, ground electrodes are formed on the opposed side faces of the antenna element unit and the module substrate unit, and the signal lines and the ground electrodes are electrically connected to each other, respectively, by fitting through the projection/recess structure portions.

In an aspect of the present invention, a base film on which a ground electrode is formed is stuck over the bottom faces of the antenna element unit and said module substrate unit.

In an aspect of the present invention, a space portion is formed between the antenna element unit and a region of the module substrate unit where the signal processing circuit is formed.

According to the present invention, in a dielectric antenna module in which an antenna element unit in which a radiation electrode and a signal line are formed on a dielectric substrate, and a module substrate unit on which a signal processing circuit is formed, are disposed and connected to each other so that bottom faces of the respective units are in a single plane, the antenna element unit and the module substrate unit are connected to each other by fitting through projection/recess structures formed on the respective opposed faces of the antenna element unit and the module substrate unit. Thus, the antenna element unit can be designed so as to be thicker by the thickness of the module substrate unit at the maximum. This makes it easy to design in consideration of the antenna performance and thinning the dielectric antenna module.

In addition, signal lines are formed on the projection/recess structures formed on the respective opposed faces of the antenna element unit and the module substrate unit, ground electrodes are formed on the respective opposed faces, and the signal lines and the ground electrodes are electrically connected to each other, respectively, by fitting through the projection/recess structures. Thus, the electric signal loss can be held down without being increased.

Further, because a space portion is formed between the antenna element unit and the signal processing circuit region of the module substrate unit, the interference between electromagnetic components of the antenna element unit and the signal processing circuit can be suppressed to be little. Further, because a ground electrode is formed in the inner face of the space portion, the interference of the electromagnetic components can be more suppressed.

In order to achieve the above object, there is also provided a dielectric antenna module comprising:
 an antenna unit; and
 a signal processing circuit unit,
 wherein the antenna unit and the signal processing circuit unit is formed on a single dielectric substrate, a space portion is provided between the antenna unit and the signal processing circuit unit, and a ground electrode is formed on an end face of the dielectric substrate defining the space portion and/or in a region in the dielectric substrate on a periphery of the space portion.

In an aspect of the present invention, the space portion is made into a through-hole or a notch structure formed in the dielectric substrate. In an aspect of the present invention, the space portion is in the form of a recess formed in at least one of an upper face and a bottom face of the dielectric substrate. In an aspect of the present invention, the ground electrode formed in the region in the dielectric substrate on the periphery of the space portion comprises a through-hole having an inner surface on which a conductive layer is formed.

In an aspect of the present invention, a parasitic element is further disposed on an upper face of the antenna unit. In an aspect of the present invention, the antenna unit comprises an additional space portion formed in the dielectric substrate and a radiation electrode formed over the additional space portion.

According to the present invention, by the construction in which a space portion is provided between the antenna unit and the signal processing circuit unit and a ground electrode is formed in the inner wall of the space portion, it can be reduced that electromagnetic components of the antenna unit and the signal processing circuit unit propagate in the dielectric substrate to interfere with each other. In addition, because the antenna unit and the signal processing circuit unit are formed on a single substrate, no base substrate is required and thus low profile is possible. Further, no interconnecting point is required in the signal transmission line and the length of the signal line is reduced. This can reduce loss, that is, the attenuation of signal.

BEST MODE FOR CARRYING OUT THE INVENTION

Figure 1A:
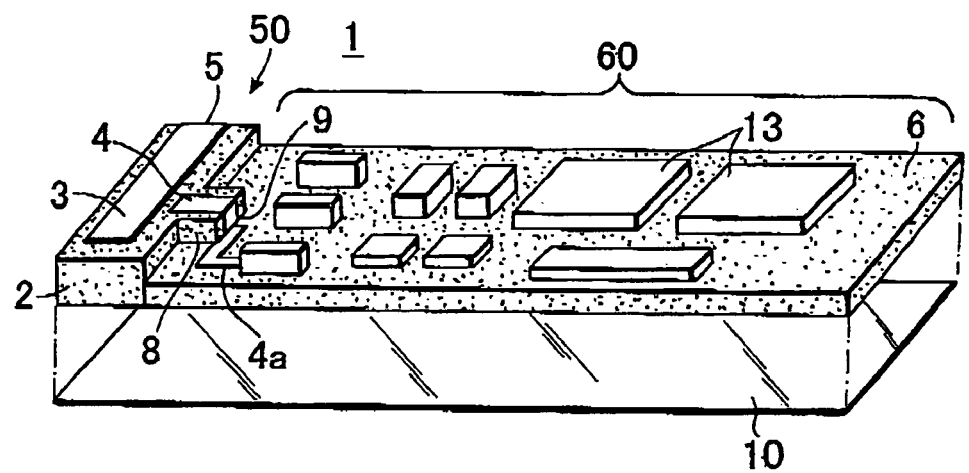
FIG. 1A is an exploded perspective view showing an embodiment of a dielectric antenna module according to the present invention.
Figure 1B:
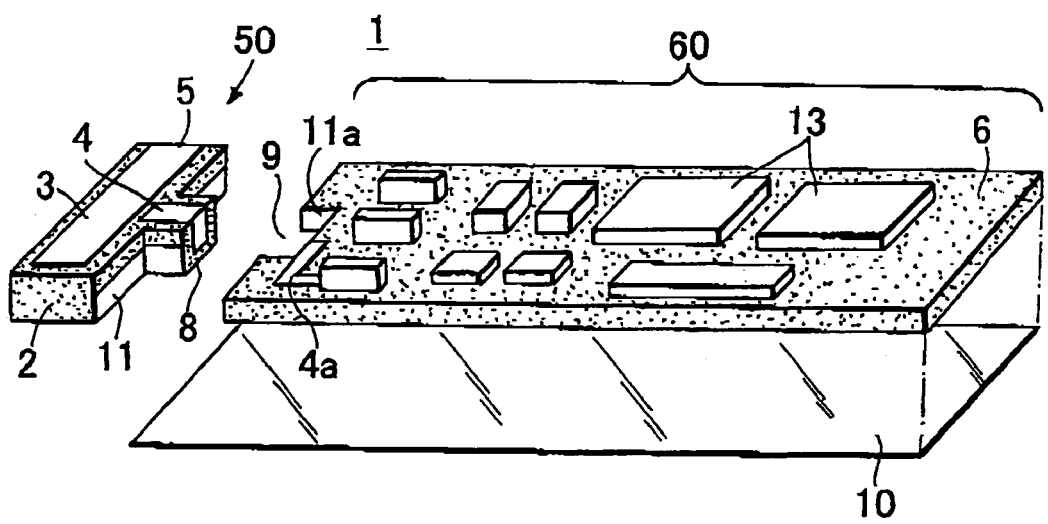
FIG. 1B is an exploded perspective view of the dielectric antenna module of FIG. 1A.

Hereinafter, embodiments of the present invention will be described in detail with reference to drawings. In the drawings, the same reference numerals denote members or parts having the same or similar functions, respectively.

FIGS. 1A and 15 are exploded perspective views showing an embodiment of a dielectric antenna module 1, in which an antenna element unit 50 including an antenna element 5 in which a radiation electrode 3 and a signal line 4 are formed on a dielectric substrate (first dielectric substrate) 2, and a module substrate unit 60 including a module substrate (second dielectric substrate) 6 on which a signal processing circuit is formed, are disposed and connected to each other so that the respective bottom faces of the antenna element unit and the module substrate unit are in a single plane.

In the antenna element unit 50, the radiation electrode 3 is formed on an upper face of the dielectric substrate 2, and the signal line 4 is formed from the upper face to a side face of the dielectric substrate 2. A bottom face of the dielectric substrate 2 is in a plane. The antenna element unit 50 may include an impedance matching circuit and other parts, in addition to the above antenna element 5.

In the module substrate unit 60, the module substrate 6 is made of a dielectric laminated substrate, in which passive parts such as capacitors are formed, and on an upper face of which a semiconductor IC 13 and so on are mounted. A signal processing circuit is constituted by the passive parts, the semiconductor IC, and so on. A bottom face of the module substrate 6 is in a plane.

In this embodiment, a projection 8 is formed in a face (side face) of the substrate 2 of the antenna element unit 50 facing the module substrate unit 60. On the other hand, a recess 9 having the shape corresponding to the projection 8 is formed at the position corresponding thereto in a face (side face) of the module substrate 6 of the module substrate unit 60 facing the antenna element unit 50. On the projection 8, the above signal line 4 for electromagnetically coupling with the radiation electrode 3 of the antenna element 5 is formed by printing conductive material or the like from an upper face to a side face of the projection. On the other hand, a signal line 4a corresponding to the above signal line 4 and connected to the above signal processing circuit is formed by printing conductive material or the like from the upper face of the module substrate 6 to a side face of the recess 9. Further, a ground electrode 11 separated from the signal line 4 is formed by printing conductive material or the like on a face (side face) of the substrate 2 of the antenna element unit 50 facing the module substrate unit 60. On the other hand, a ground electrode 11a corresponding to the above ground electrode 11 and connected to the above signal processing circuit is formed by printing conductive material or the like on a side face of the module substrate 6 including the recess 9. Thus, by fitting the projection 8 in the recess 9, the antenna element unit 50 and the module substrate unit 60 are mechanically united with each other. In addition, the signal line 4 and the ground electrode 11 are connected to the signal line 4a and the ground electrode 11a, respectively, so that the antenna element unit 50 and the module substrate unit 60 are electrically connected to each other.

The ground electrodes 11 and 11a can suppress the interference between electromagnetic components of the antenna element 5 and the signal processing circuit. These ground electrodes 11 and 11a can be formed by the manner that conductive material is printed to form a conductive layer on the side faces of the substrate 2 of the antenna element unit 50 and the module substrate 6 of the module substrate unit 60 acting as the connecting faces to each other. In place of printing conductive material on the connecting faces, as described later, these ground electrodes 11 and 11a may be formed with through-hole arrangement in which a plurality of through-holes each having an internal surface on which conductive material is printed to for a conductive layer are arranged at a position near the connecting faces at intervals of $\lambda/2$ or less, where $\lambda$ represents a signal wavelength in the dielectric of which the substrate 2 or module substrate 6 is made.

The signal lines 4 and 4a and the ground electrodes 11 and 11a formed on the connecting faces of the antenna element unit 50 and the module substrate unit 60 are connected to each other electrically and mechanically by soldering or the like.

The antenna element unit 50 and the module substrate unit 60 on which the signal processing circuit is formed are arranged so that the bottom faces of the substrate 2 and the module substrate 6 are in a single plane. Thus, the dielectric antenna module, the thickness of which hitherto could not be less than the total thickness of the module substrate 6 and the substrate 2 of the antenna element 5, can be further reduced in thickness. In addition, because the thickness of the antenna element 5 can be increased by a value corresponding to the thickness of the module substrate 6 in comparison with the conventional case, more radiation-efficient and broader-band antenna characteristics can be easily realized.

A base film 10 on which a ground electrode is formed may be stuck on the bottom face of the antenna element unit 50 (that is, the bottom face of the dielectric substrate 2) and the bottom face of the module substrate unit 60 (that is, the bottom face of the module substrate 6) on which the signal processing circuit is formed, so as to cover the whole bottom faces. By this, electrical stability is improved and the strength of the mechanical coupling between the antenna element unit 50 and the module substrate unit 60 can be improved. Although FIG. 1A and so on show the base film 10 at a position distant from the antenna element unit 50 and the module substrate unit 60 for convenience' sake, in practice, the base film 10 is stuck on the bottom faces of the antenna element unit 50 and the module substrate unit 60, as described above.

Figure 2:
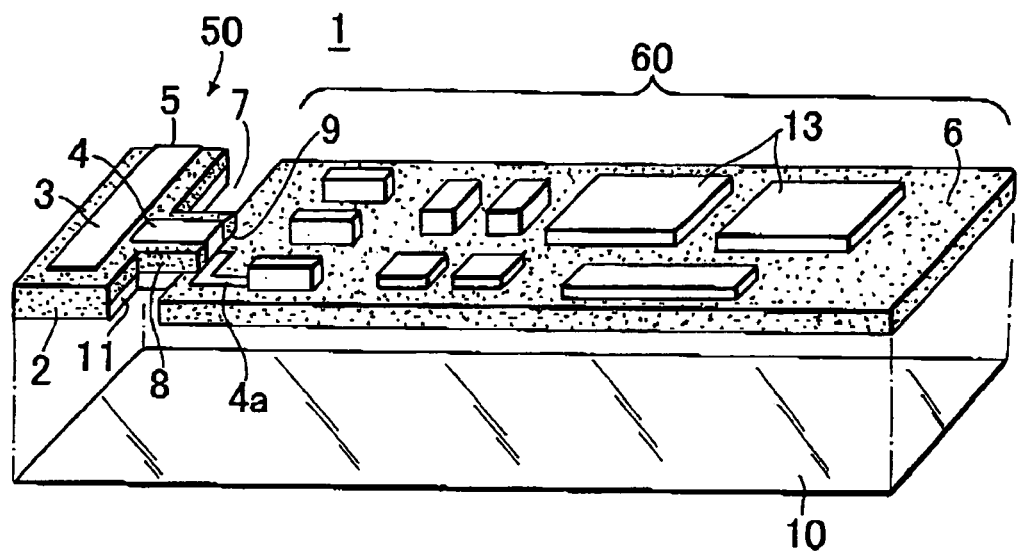
FIG. 2 is an exploded perspective view showing another embodiment of the dielectric antenna module according to the present invention.
Figure 3:
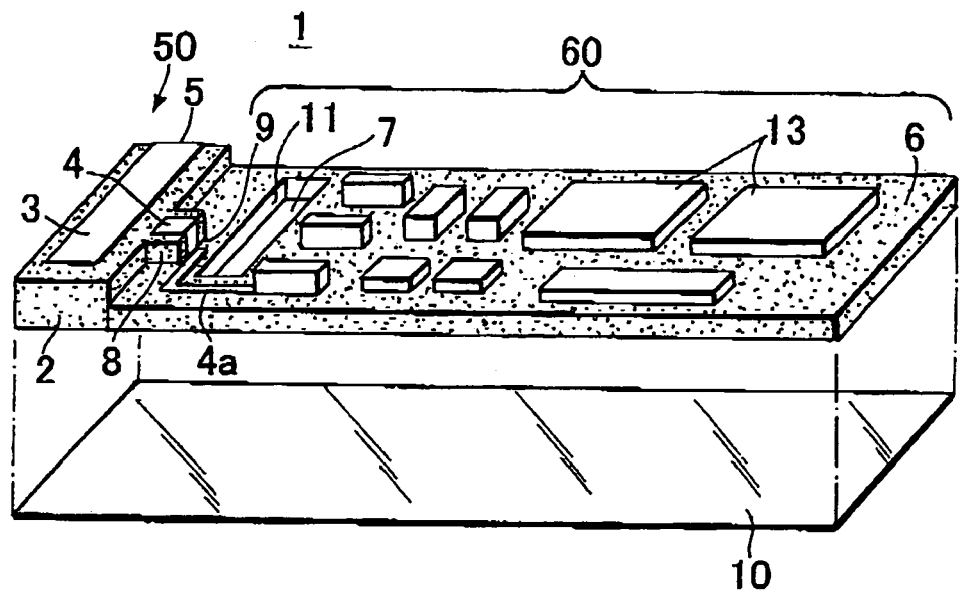
FIG. 3 is an exploded perspective view showing another embodiment of the dielectric antenna module according to the present invention.

FIG. 2 is an exploded perspective view showing another embodiment of the present invention. In this embodiment, a space portion 7 is formed between the antenna element unit 50 and the signal processing circuit region of the module substrate unit 60. The space portion 7 is formed by providing a gap between the side faces of the substrate 2 of the antenna element unit 50 and the module substrate 6 of the module substrate unit 60 other than the areas where the projection/recess are formed. By the presence of the space portion 7, the interference between electromagnetic components of the antenna element 5 and the signal processing circuit can be suppressed. The space portion 7 may be formed as a through-hole in the module substrate 60 at a position between the signal processing circuit region (the region where elements such as the semiconductor IC 13 and so on are mounted) of the module substrate unit 60 and the antenna element unit 50, as shown in FIG. 3, or it may be formed as a notch. A ground electrode 11 made of conductive material is formed on the internal surface of the space portion 7 so that the interference between electromagnetic components of the antenna element 5 and the signal processing circuit can be more reduced.

The dielectric material used for the dielectric substrate 2 of the antenna element unit 50 and the module substrate 6 of the module substrate unit 60 may be ceramic or polymer, or a composite thereof. In particular, ceramic causing little dielectric loss is preferable.

The radiation electrode 3 and the signal line 4 of the antenna element 5 are formed with conductive paste or by plating. In case of using a laminated body as the dielectric substrate 2, a part of the signal line 4 or the like may be formed within the dielectric substrate. The signal line 4a of the module substrate unit 60 is formed with conductive paste or by plating. In case of using a laminated body as the module substrate 6, a part of the signal line-4a or the like may be formed within the module substrate.

Figure 4A:
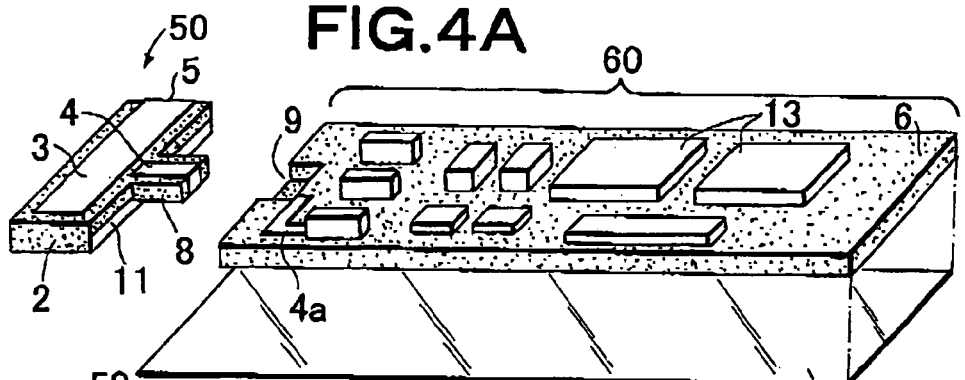
FIG. 4A is an exploded perspective view showing another embodiment of connection between an antenna element unit and a module substrate unit.
Figure 4B:
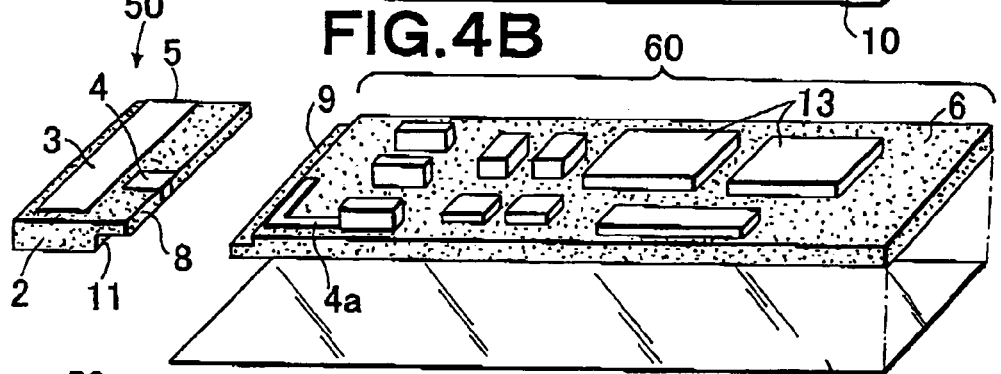
FIG. 4B is an exploded perspective view showing another embodiment of connection between the antenna element unit and the module substrate unit.
Figure 4C:
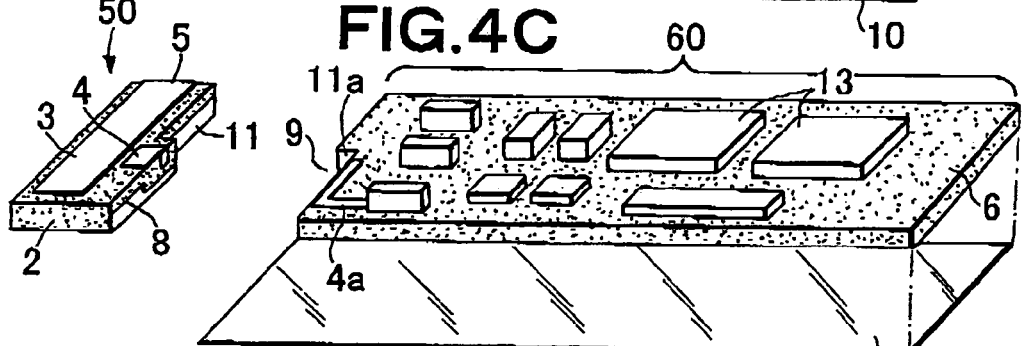
FIG. 4C is an exploded perspective view showing another embodiment of connection between the antenna element unit and the module substrate unit.

FIGS. 4A to 4D are explanatory views showing other embodiments of the connection between the antenna element unit 50 and the module substrate unit 60. In the embodiment of FIG. 4A, the projection 8 is formed on the connecting face of the substrate 2 of the antenna element unit 50 to the module substrate 6, partially with respect to the direction of thickness of the substrate (in the upper half portion in the drawing). To correspond to this, the recess 9 is formed also partially with respect to the direction of thickness of the substrate. In the embodiment of FIG. 4B, the projection 8 is formed on the connecting face of the substrate 2 of the antenna element unit 50 to the module substrate 6, over the whole length of the connecting face and partially with respect to the direction of thickness of the substrate (in the upper half portion in the drawing). To correspond to this, the recess 9 is formed also over the whole length of the connecting face of the module substrate 6 to the antenna element substrate 2 and partially with respect to the direction of thickness of the substrate. In the embodiment of FIG. 4C, the projection 8 is formed on the connecting face of the substrate 2 of the antenna element unit 50 to the module substrate 6, in a half portion (the half portion on this side in the drawing) of the length of the connecting face. To correspond-to this, the recess 9 is formed also in a half portion of the length of the connecting face of the module substrate 6 to the antenna element substrate 2.

Figure 4D:
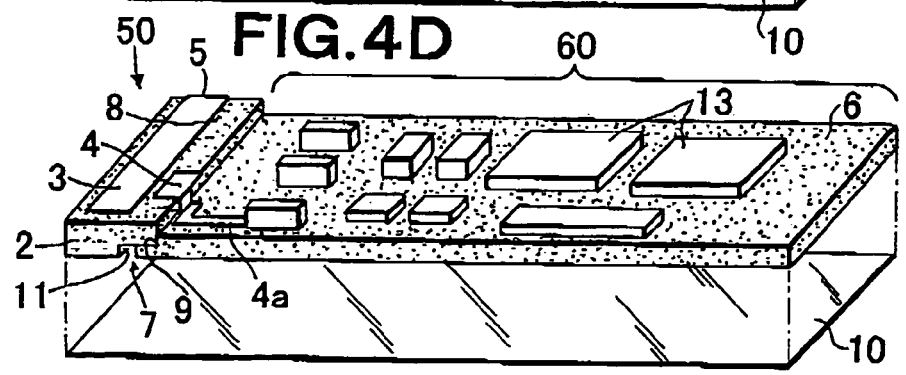
FIG. 4D is an exploded perspective view showing the embodiment of FIG. 4B.

In any of those, the projection length (the distance-in the left and right direction in the drawings) of the projection 8 of the substrate 2 of the antenna element unit 50 is larger than the depth (the distance in the left and right direction in the drawings) of the recess 9 formed in the end face of the module substrate 6. Thus, when the projection 8 is fitted in the recess 9, a space is formed between the substrate 2 and the module substrate 6. FIG. 4D shows a state wherein the antenna element unit 50 and the module substrate unit 60 of the embodiment of FIG. 4B are connected to each other to form a space portion 7.

Figure 5:
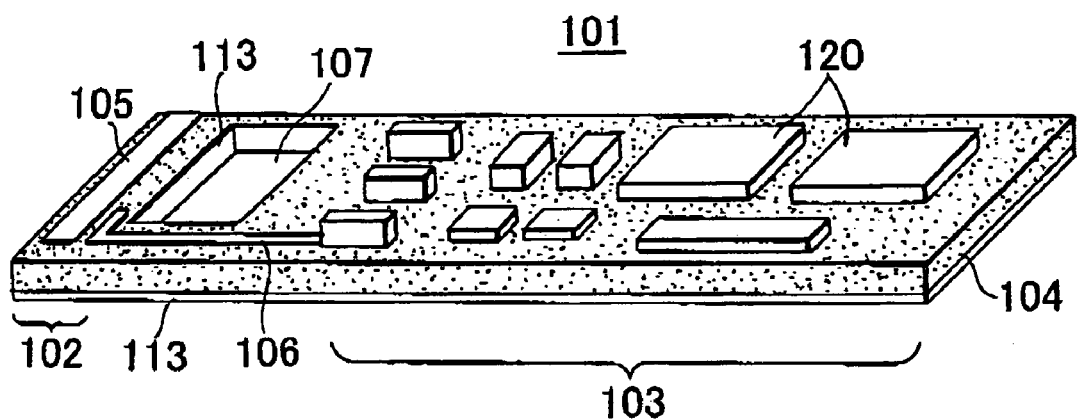
FIG. 5 is a perspective view showing an embodiment of a dielectric antenna module according to the present invention.

FIG. 5 is a perspective view showing an embodiment of a dielectric antenna module according to the present invention. The antenna module 101 of FIG. 5 has a construction in which an antenna unit 102 and a signal processing circuit unit 103 are formed on a single dielectric substrate 104; a space portion 107 is provided between the antenna unit 102 and the signal processing circuit unit 103; and a ground electrode 113 is formed on an end face defining the space portion.

The antenna unit 102 includes the above dielectric substrate 104 and a radiation electrode 105 formed on the upper face of the dielectric substrate 104. A signal transmission line (signal line) 106 extending from the radiation electrode 5 to the above signal processing circuit unit 103 is formed on the upper face of the dielectric substrate 104. The radiation electrode 105 and the signal transmission line 106 are formed with conductive paste or by plating. In case of using a dielectric substrate 104 having a laminated structure, a part of the circuit constituted by the signal transmission line 106 and others may be formed within the substrate 2.

The signal processing circuit unit 103 has a construction in which passive parts such as capacitors are formed in the dielectric substrate 104 and a semiconductor IC 120 and so on are mounted on the upper face of the substrate.

A space portion 107 is formed between the antenna unit 102 and the signal processing circuit unit 103. Because the space portion 107 exists, the interference between electromagnetic components of the antenna unit 102 and the signal processing circuit unit 103 can be suppressed. In the embodiment of FIG. 5, the space portion 107 is made into a through-hole. A ground electrode 113 is formed on an inner wall of the through-hole 107, that is, on a substrate end face defining the space portion 107. The ground electrode is formed to extend over the bottom face of the substrate 104. Because the space portion 107 is made into a through-hole, the interference between electromagnetic components of the antenna unit 102 and the signal processing circuit unit 103 can be considerably suppressed, and the antenna unit 102 and the signal processing circuit unit 103 are mechanically strongly united with each other by both end portions of the substrate at the through-hole formation portion.

Figure 6:
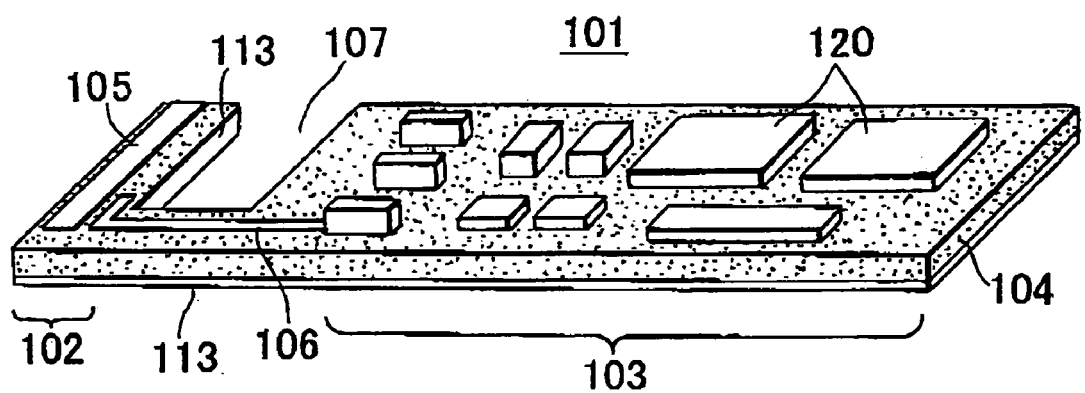
FIG. 6 is a perspective view showing another embodiment of the dielectric antenna module according to the present invention.

FIG. 6 is a perspective view showing an embodiment of a dielectric antenna module according to the present invention. The space portion 107 may not be made into a through-hole and may be made into a notch structure as shown in FIG. 6. In this case, there is an advantage that processing is easy. A ground electrode 113 is formed on a substrate end face defining the space portion 107 caused by the notch structure. Further, the space portion 107 may be filled up with material low in dielectric constant and large in dielectric loss. As the material large in dielectric loss; carbon rubber, urethane foam containing carbon, polystyrene foam containing carbon, and so on, are known. In this case, the interference between electromagnetic components of the antenna unit 102 and the signal processing circuit unit 103 can be more considerably suppressed, and the strength of the module is increased.

Figure 7A:
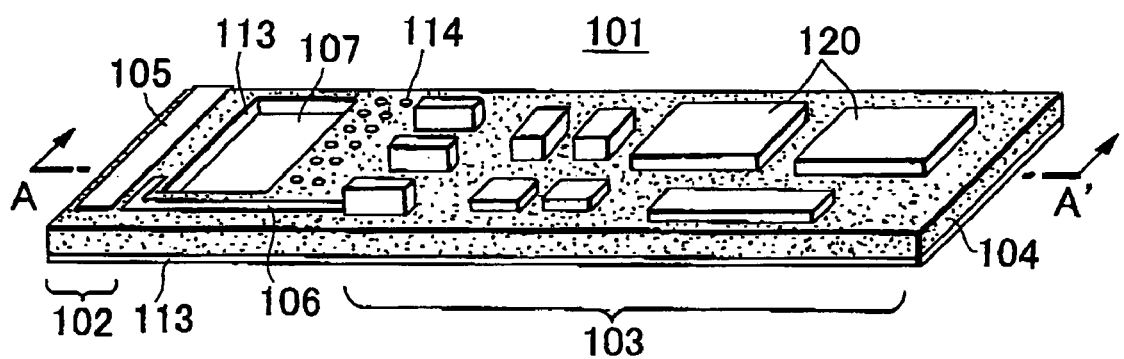
FIG. 7A is a perspective view showing another embodiment of the dielectric antenna module according to the present invention.
Figure 7B:
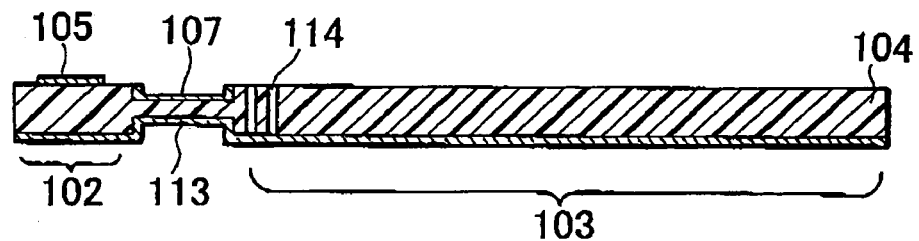
FIG. 7B is a sectional view taken along line A–A' in FIG. 7A.

FIG. 7A is a perspective view showing still another embodiment of the present invention. FIG. 7B is a sectional view taken along line A–A' in FIG. 7A. In this embodiment, in the space portion 107, as shown in FIG. 7B, recessed structures (recesses) are formed on both faces of the dielectric substrate 4 between the antenna unit 102 and the signal processing circuit unit 103. The ground electrode 113 extends to the inner surface of the recess. The recessed structures may be formed at the same position of the front surface (upper face) and the back surface (bottom face) or may be formed at different positions. Further, a recessed structure may be formed only one of the front and back surfaces. In the embodiment of FGS. 7A and 7B, not only the ground electrode 113 is formed in the inner surface of the space portion 107, but also a plurality of through-holes 114 each having an inner surface on which conductive material is coated to form a conductive layer as described above are arranged in the vicinity of the space portion 107. By this, the interference between electromagnetic components of the antenna unit and the signal processing circuit unit is made harder to occur. Even in case that no ground electrode is formed in the inner surface of the space portion 107 and only a plurality of through-holes 114 each having the inner surface on which the conductive material is coated are formed, the effect of preventing the interference between electromagnetic components of the antenna unit and the signal processing circuit unit can be obtained.

The dielectric material used for the dielectric substrate 104 of the antenna module suffices if it can be molded. It may be ceramic or polymer, or a composite thereof. In particular, ceramic material causing little dielectric loss is preferable.

Figure 8:
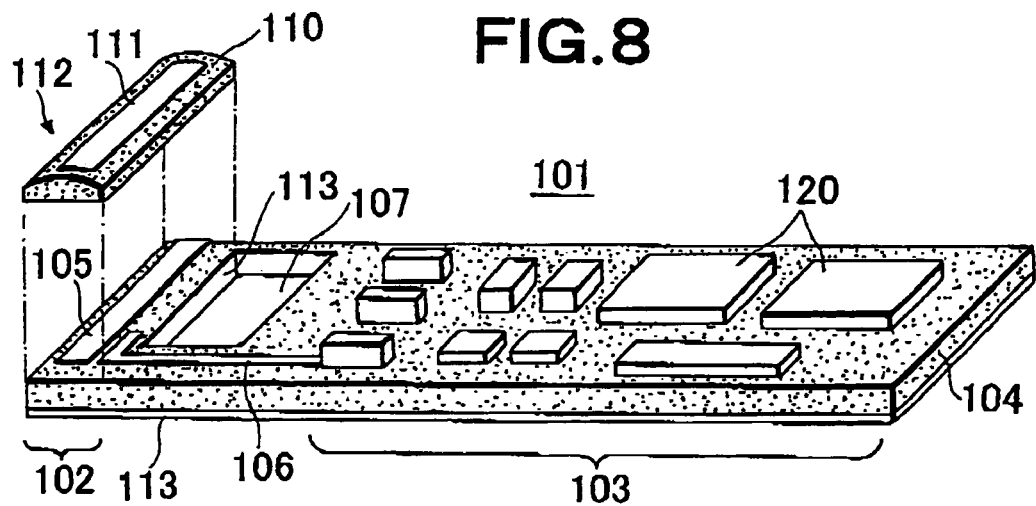
FIG. 8 is an exploded perspective view showing another embodiment of the dielectric antenna module according to the present invention.

FIG. 8 is a perspective view showing another embodiment of the present invention. In this embodiment, a parasitic element 112 is further mounted on the upper face of the antenna unit 102. In the parasitic element 112, a radiation electrode 111 is formed on the upper face of a dielectric member 110. The material of the dielectric member 110 may be ceramic or polymer, or a composite thereof.

In an antenna assembled in a casing, because the antenna characteristics vary, there is a case wherein no radio wave is radiated into a required space region or no sufficient sensitivity is obtained. However, by disposing the parasitic element 112 on the upper portion of the antenna, the directivity of radio wave radiated from the antenna can be controlled, thereby solving the above problem. The control of the directivity can be made by setting the dielectric constant and shape of the dielectric member 110 as the supporting member of the parasitic element 112, and further the shape and position of the radiation electrode 111.

Figure 9:
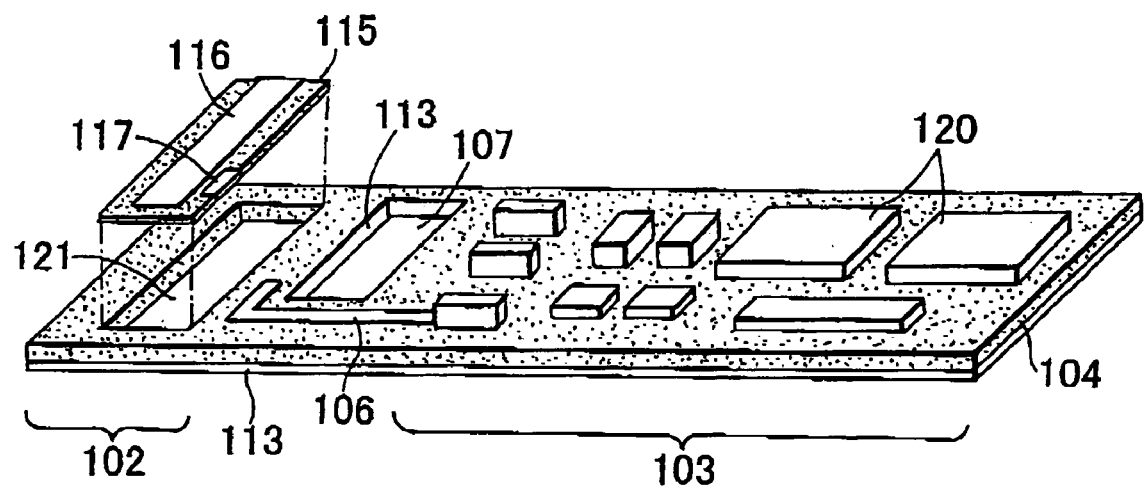
FIG. 9 is an exploded perspective view showing another embodiment of the dielectric antenna module according to the present invention.
Figure 10:
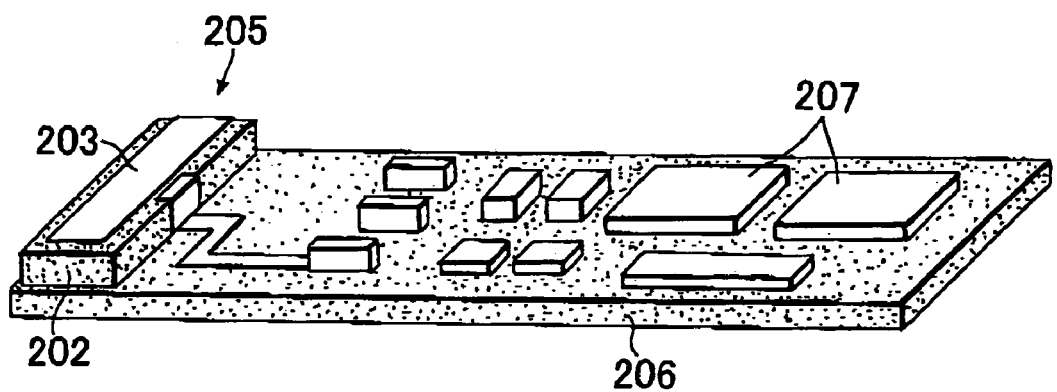
FIG. 10 is a perspective view showing an example of a conventional communication module.

FIG. 9 is a perspective view showing still another embodiment of the present invention. An antenna unit 102 according to the present invention may have a construction in which an additional space portion 121 is formed in a substrate 104 and a radiation electrode 116 is disposed above the space portion 121. As the radiation electrode 116, a molded metal plate or a conductive electrode formed on a dielectric film 115 may be used. A signal transmission line 117 to be connected to the signal transmission line 106 is formed on the dielectric film 115.

According to this embodiment, in case that the dielectric constant of the material of the module substrate used is not optimum because it is too high for the antenna unit, by forming the space portion 121 in the antenna unit, the substantial dielectric constant is reduced to be optimized. In addition, by forming the space portion 121, the antenna module can be light in weight.

As the dielectric film 115 on which the radiation electrode 116 is formed, a film can be used that is made of ceramic or polymer, or a composite thereof. On the dielectric film may be formed the signal transmission line 117 and other conductive patterns in addition to the radiation electrode 116. In addition, by using the dielectric film 115 on which the radiation electrode 116 is formed, the control of the directivity, which was less in the degree of freedom in case of a plane radiation electrode, can be widely made by changing the dielectric distribution and shape of the dielectric film and further the shape and position of the radiation electrode. For example, by curving the dielectric film to protrude upward, an antenna with wide directivity can be made.

INDUSTRIAL APPLICABILITY

As described above, according to the present invention, in a dielectric antenna module, an antenna element unit in which a radiation electrode and a signal line are formed on a dielectric substrate, and a module substrate unit on which a signal processing circuit is formed, are disposed so that the bottom faces thereof are in a single plane. The antenna element unit and the module substrate unit are connected to each other by fitting through projection/recess structures formed on side faces of the respective units. Thus, reduction in thickness of the dielectric antenna module is possible. In addition, by connecting the signal lines at the above projection/recess portions or the like, electric signal loss can be held down. Further, because a space portion and a ground electrode are formed between the above antenna element unit and the signal processing circuit region of the above module substrate unit, the interference between electromagnetic components of the antenna element and the signal processing circuit can be suppressed.

Further, as described above, according to the present invention, an antenna unit and a signal processing circuit unit are formed on a single substrate. A space portion is provided between the antenna unit and the signal processing circuit unit. A ground electrode is formed on an inner wall of the space portion. Thus, an antenna module is obtained in which the interference between electromagnetic components of the antenna and the signal processing circuit is hard to occur, there is little loss of electric signals, and the height of the antenna module when mounted is small.

The invention claimed is:

1. A dielectric antenna module comprising:
an antenna element unit having a first dielectric substrate having an upper face and bottom face and a side face connecting edges of the upper and bottom faces of the first dielectric substrate to each other, and having radiation electrode and a signal line which are formed on the upper face of the first dielectric substrate; and
a module substrate unit having a second dielectric substrate having an upper face and bottom face and a side face connecting edges of the upper and bottom faces of the second dielectric substrate to each other, and having a signal processing circuit formed on the second dielectric substrate,
wherein one of the side faces of said first and second dielectric substrates has a projection and the other of the side faces of said first and second dielectric substrates has a recess having a shape corresponding to that of the projection,
said antenna element unit and said module substrate unit are disposed so that the bottom faces of said first and second dielectric substrates are in a common single plane, and
the side faces of said first and second dielectric substrates are opposed and connected to each other by fitting the projection to the recess, and
wherein signal lines are formed on the opposed side faces of said first and second dielectric substrates, a ground electrode is formed on at least one of the opposed side faces of said first and second dielectric substrates, and said signal lines on the opposed side faces are electrically connected to each other.

2. The dielectric antenna module according to claim 1, wherein a base film on which a ground electrode is formed is stuck over the bottom faces of said first and second dielectric substrates so that the ground electrode formed on the at least one of the opposed side faces is electrically connected the ground electrode formed on the base film.

3. A dielectric antenna module comprising:
an antenna element unit having a first dielectric substrate having an upper face and bottom face and a side face connecting edges of the upper and bottom faces of the first dielectric substrate to each other, and having a radiation electrode and a signal line which are formed on the upper face of the first dielectric substrate; and
a module substrate unit having a second dielectric substrate having an upper face and bottom face and a side face connecting edges of the upper and bottom faces of the second dielectric substrate to each other, and having a signal processing circuit formed on the second dielectric substrate, wherein one of the side faces of said first and second dielectric substrates has a projection and the other of the side faces of said first and second dielectric substrates has a recess having a shape corresponding to that of the projection, said antenna element unit and said module substrate unit are disposed so that the bottom faces of said first and second dielectric substrates are in common single plane, and the side faces of said first and second dielectric substrates are opposed and connected to each other by fitting the projection to the recess, wherein signal lines are formed on the opposed side faces of said first and second dielectric substrates, and said signal lines on the opposed side faces are electrically connected to each other, and wherein a space portion is formed between said antenna element unit and a region of said module substrate unit where said signal processing circuit is formed.

4. The dielectric antenna module according to claim 3, wherein said space portion is formed in a portion of the opposed side faces of said first and second dielectric substrates other than said projection and recess.

5. The dielectric antenna module according to claim 3, wherein said space portion is formed in said second dielectric substrate.

* * * * *